United States Patent [19]

Martheli

[11] Patent Number: 4,990,865
[45] Date of Patent: Feb. 5, 1991

[54] TRANSISTOR MICROWAVE OSCILLATOR HAVING ADJUSTABLE ZONE OF POTENTIAL INSTABILITY

[75] Inventor: Michel Martheli, Jouy le Moutier, France

[73] Assignee: Alcatel N.V., Amsterdam, Netherlands

[21] Appl. No.: 493,919

[22] Filed: Mar. 14, 1990

[30] Foreign Application Priority Data

Mar. 15, 1989 [FR] France .................. 89 03411

[51] Int. Cl.$^5$ .............................................. H03B 5/18
[52] U.S. Cl. ................... 331/99; 331/117 D; 331/117 FE
[58] Field of Search ......... 331/96, 99, 117 D, 117 FE

[56] References Cited

U.S. PATENT DOCUMENTS

| | | | |
|---|---|---|---|
| 4,639,690 | 1/1987 | Lewis | 331/96 |
| 4,684,904 | 8/1987 | Watkins et al. | 331/117 R |
| 4,736,169 | 4/1988 | Weaver et al. | 331/117 R |
| 4,736,454 | 4/1988 | Hirsch | 455/129 |
| 4,758,804 | 7/1988 | Inoue et al. | 331/99 |

OTHER PUBLICATIONS

NEC Electronics (Europe) GmbH; Preliminary Data Sheet for NPN Silicon High Frequency Transistor NE856 (10 pages, Jun. 1985).

*Primary Examiner*—Siegfried H. Grimm
*Attorney, Agent, or Firm*—Christie, Parker & Hale

[57] ABSTRACT

A microwave oscillator having at least one transistor (1), which may be bipolar or otherwise. A tunable reactive circuit (13, 15, 16) suitable for adjusting the transistor's zone of potential instability is inserted in the emitter circuit of the transistor (1) (or in the source circuit of an FET). The reactive circuit comprises a series length of transmission line (13) and a parallel capacitance (15, 16) constituted, at least in part, by a conducting slab (15) of adjustable size.

3 Claims, 1 Drawing Sheet

TRANSISTOR MICROWAVE OSCILLATOR HAVING ADJUSTABLE ZONE OF POTENTIAL INSTABILITY

The present invention relates to a microwave oscillator having at least one transistor which may be bipolar or otherwise.

Most currently implemented transistor microwave oscillators, regardless of whether the transistor is bipolar or field effect, and in particular those where tuning is obtained by acting on the base of the transistor are provided with a bias circuit where the collector (or the drain) is directly connected to ground (see for example Documents US-A-4 684 904 and US-A-4 736 169). This has the consequence of creating potential instability in the transistor, which instability is directly related to the transistor and is therefore not controlled. This frequently gives rise to parasitic oscillations and also to low frequency ringing.

In order to produce oscillations in an imposed frequency band, it is often necessary to provide a quarter-wave impendance transforming transmission line at the output from the oscillator, which not only occupies considerable space, but also requires the outlet impedance of the oscillator to be well defined.

The invention seeks to remedy these drawbacks. To this end it provides a microwave oscillator having at least one transistor which may be bipolar or otherwise, wherein the bias circuit includes in its emitter electrode circuit for a bipolar transistor or in its source electrode circuit for an FET, a tunable reactive circuit comprising a length of transmission line connected in series in the bias circuit and capacitance which is connected in parallel at radio frequencies between said electrode and ground.

The invention will be well understood, and its advantages and other characteristics appear from the following description of the oscillator given with reference to the accompanying drawing, in which.

Figure 1:
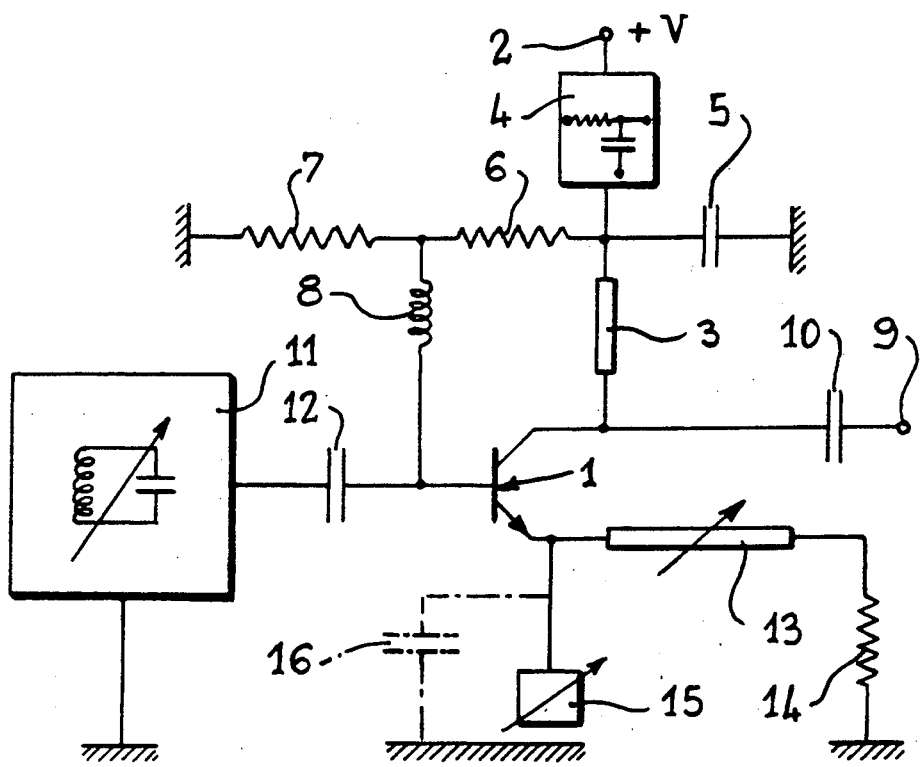
FIG. 1 is a circuit diagram of the oscillator.

With reference to FIG. 1, reference 1 designates a bipolar transistor in a microwave oscillator. In this example, the transistor is an NPN transistor, e.g. a transistor which is commercially available under the reference NE 85635.

The collector on the transistor 1 is connected to terminal 2 of a DC power supply voltage +V via a length of transmission line 3 which has high impedance at radiofrequency, and via a low frequency decoupling circuit 4. A capacitance 5 is connected between ground and the point where the circuit 4 is connected to the length of transmission line 3, thereby providing radio-frequency decoupling of the DC voltage +V.

A bridge of resistances 6 and 7 is connected between the same connection point and ground, providing bias for the base of the transistor 1 via a choke 8. The collector of the transistor 1 is connected to the output terminal 9 of the oscillator via a radiofrequency coupling capacitance 10.

In completely conventional manner, the base of the transistor 1 is connected to the oscillator tuning circuit 11 via a large value radiofrequency coupling capacitance 12 (e.g. having a capacitance of several tens of picofarads).

In accordance with the invention, the frequency and the bandwidth at which the transistor 1 is potentially unstable are selected by inserting a tunable reactive circuit in the transistor's emitter circuit, the tunable circuit comprising:

an adjustable length of transmission line 13 having high impedance at radiofrequencies and connected between ground and the emitter in series with a bias resistance 14; and an adjustable capacitance 15 of very low value, connected between said emitter and ground, in microstrip technology, the adjustable capacitance being provided in the form of a conducting "slab" of adjustable size.

Increasing the size of the slab 15 or lengthening the length of transmission line 13 is equivalent to reducing the frequency values at which the transistor is potentially unstable, and thus of reducing the frequency values at which the oscillator is capable of operating without any danger of parasitic oscillator ringing.

It should be observed that when the value of this tunable capacitance needs to be relatively large, it is advantageous to connect a discrete capacitor 16, e.g. a "chip" capacitor, in parallel with the adjustable slab 15.

Figure 2:
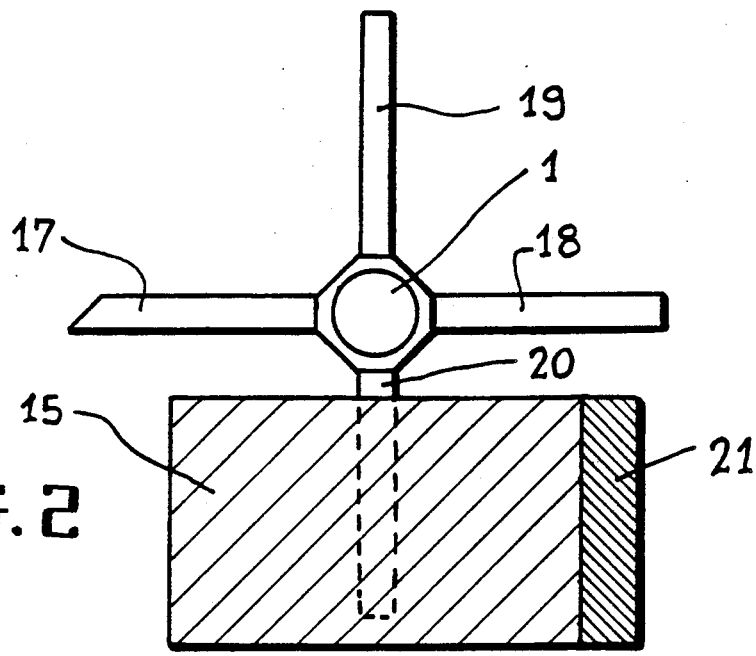
FIG. 2 shows one embodiment of the tunable capacitance placed in the emitter circuit of the transistor.

FIG. 2 shows how a small adjustable capacitance 15 can be made using microstrip technology.

The transistor 1 is shown from above and has four connection leads, all in the form of microstrips:

a base connection lead 17;

a collector connection lead 18; and two emitter connection leads 19 and 20 which are electrically interconnected on the "chip" constituting the transistor 1.

Emitter lead 20 is soldered to a slab 15, i.e. to a fine conducting plate made using microstrip technology. Given that it is separated from the ground plane by an insulating layer which constitutes the substrate, the slab 15 together with the ground plane constitutes a very low value capacitance connected between ground and the emitter of transistor 1.

The value of this capacitance 15 is advantageously adjusted by increasing the size of the slab 15 using lines of conducting ink 21.

Naturally, the invention is not limited to the embodiment described above. For example, the radiofrequency output 9 could be taken from an electrode other than the collector. Instead of using a bipolar transistor, it would also be possible to use an FET (field effect transistor), in which case the tunable reactive circuit 13, 15 should be connected in the source electrode circuit of the FET. The invention naturally applies to all sorts of microwave oscillators, regardless of whether or not they are voltage controlled (VCO), and if they are voltage controlled oscillators, regardless of whether they are oscillators having two control gradients or not.

I claim:

1. A microwave oscillator including at least one transistor (1), characterized in that the bias circuit for the transistor comprises, in the emitter circuit of a bipolar transistor or in the source circuit of a transistor of the FET type, a tunable reactive circuit (13, 15, 16) suitable for adjusting the transistor's zone of potential instability, said tunable reactive circuit being constituted by a length of transmission line (13) connected in series in the bias circuit (13, 14) and by a capacitance (15, 16) connected in parallel from the radiofrequency point of view between ground and the emitter or source electrode of the transistor (1).

2. A microwave oscillator according to claim 1, characterized in that said capacitance comprises a conducting slab (15) of adjustable size.

3. A microwave oscillator according to claim 2, characterized in that said capacitance further includes a discrete capacitor (16) connected in parallel with the conducting slab (15).

* * * * *